United States Patent
Abe

(10) Patent No.: US 10,498,323 B2
(45) Date of Patent: Dec. 3, 2019

(54) VEHICLE-MOUNTED SIGNAL GENERATION CIRCUIT AND VEHICLE-MOUNTED POWER SUPPLY DEVICE

(71) Applicants: AUTONETWORKS TECHNOLOGIES, LTD., Yokkaichi, Mie (JP); SUMITOMO WIRING SYSTEMS, LTD., Yokkaichi, Mie (JP); SUMITOMO ELECTRIC INDUSTRIES, LTD., Osaka-shi, Osaka (JP)

(72) Inventor: Takenori Abe, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 19 days.

(21) Appl. No.: 16/032,666

(22) Filed: Jul. 11, 2018

(65) Prior Publication Data

US 2019/0020336 A1    Jan. 17, 2019

(30) Foreign Application Priority Data

Jul. 14, 2017    (JP) .................................. 2017-137879

(51) Int. Cl.
*H03K 7/08*    (2006.01)
*H02M 3/158*    (2006.01)
(Continued)

(52) U.S. Cl.
CPC ................ *H03K 7/08* (2013.01); *H02M 1/08* (2013.01); *H02M 3/157* (2013.01); *H02M 3/158* (2013.01);
(Continued)

(58) Field of Classification Search
CPC .......... H03K 7/08; H02M 3/157; H02M 1/08; H02M 2001/0012; H02M 3/158;
(Continued)

(56) References Cited

U.S. PATENT DOCUMENTS 6,911,808 B1 *    6/2005    Shimamori ........... H02M 3/157
                                                          323/283

FOREIGN PATENT DOCUMENTS

JP    H03-098470 A    4/1991
JP    2010-130850 A   6/2010

* cited by examiner

*Primary Examiner* — Ryan Johnson
(74) *Attorney, Agent, or Firm* — Oliff PLC

(57) ABSTRACT

A vehicle-mounted signal generation circuit for generating a PWM signal to be provided to a voltage conversion device that outputs an output voltage generated by converting an input voltage with an on/off operation of a switch according to the PWM signal, the vehicle-mounted signal generation circuit including an electronic control unit that is configured to: generate the PWM signal for the voltage conversion device; set a target duty ratio, which is a target value of a duty ratio of the PWM signal, based on an output from the voltage conversion device; set a cycle setting value of the PWM signal and to change the cycle setting value set according to passage of time; and set an output duty ratio, which is a value of a duty ratio based on the target duty ratio set and the cycle setting value set.

6 Claims, 8 Drawing Sheets

(51) Int. Cl.
*H02M 1/08* (2006.01)
*H02M 3/157* (2006.01)
*H02M 1/00* (2006.01)

(52) U.S. Cl.
CPC .. *B60L 2210/10* (2013.01); *H02M 2001/0012* (2013.01)

(58) Field of Classification Search
CPC .............. H02M 3/1582; B60L 2210/10; B60L 2210/12; B60L 2210/14
See application file for complete search history.

| IDEAL DUTY D1 | 23.40% |
|---|---|

| CYCLE SETTING VALUE Ts(ns) | 10225 |
|---|---|

| FIRST ON-TIME ty1(D1 × Ts) (ns) | 2392.65 |
|---|---|

FIG. 7A

RELATIONSHIP WITH
CANDIDATE SETTING VALUES (RESOLUTION:5ns)

| CANDIDATE SETTING VALUE(ns) | DIFFERENCE FROM FIRST ON-TIME | DUTY RATIO AT Ts | DIFFERENCE FROM IDEAL DUTY RATIO |
|---|---|---|---|
| ⋮ | ⋮ | ⋮ | ⋮ |
| 2385 | −7.6500 | 23.3252% | −0.0748% |
| 2390 | −2.6500 | 23.3741% | −0.0259% |
| 2395 | 2.6500 | 23.4230% | 0.0230% |
| 2400 | 7.3500 | 23.4719% | 0.0719% |
| 2405 | 12.3500 | 23.5208% | 0.1208% |
| ⋮ | ⋮ | ⋮ | ⋮ |

SELECT "2395" AS SECOND ON-TIME ty2
HOWEVER, BY ONLY SELECTING THIS, DUTY RATIO IS LARGER THAN IDEAL DUTY RATIO D1 BY 0.0230%

FIG. 7B

| ON-TIME (SECOND ON-TIME ty2) (ns) | 2395 |
|---|---|

| IDEAL DUTY RATIO D1 | 23.40% |
|---|---|

CHANGE RESULT OF CYCLE (D2:5ns)

|  | VALUE OF CYCLE(ns) | DUTY RATIO IN EACH CYCLE | DIFFERENCE FROM IDEAL DUTY RATIO |
|---|---|---|---|
| CYCLE SETTING VALUE Ts | 10225 | 23.4230% | 0.0230% |
| CHANGED CYCLE (N=1) | 10230 | 23.4115% | 0.0115% |
| CHANGED CYCLE (N=2) | 10235 | 23.4001% | 0.0001% |
| CHANGED CYCLE (N=3) | 10240 | 23.3887% | -0.0113% |
| CHANGED CYCLE (N=4) | 10245 | 23.3773% | -0.0227% |

FIG. 8

VEHICLE-MOUNTED SIGNAL GENERATION CIRCUIT AND VEHICLE-MOUNTED POWER SUPPLY DEVICE

This application claims priority to Japanese Patent Application No. 2017-137879 filed on Jul. 14, 2017, the entire contents of which are incorporated herein by reference.

BACKGROUND

The present disclosure relates to a vehicle-mounted signal generation circuit and a vehicle-mounted power supply device.

Conventionally, a voltage conversion device for converting a voltage by driving a switching element with PWM (Pulse Width Modulation) signals has been widely used. In this PWM control voltage conversion device, for example, a voltage command value is calculated based on a target value of a voltage, a value according to the calculated voltage command value is set in a PWM signal generation unit, and thus PWM signals having a duty ratio according to the set value is generated. In this manner, by changing the duty ratio of the PWM signals that drive the switching element in accordance with the target value of the voltage, an output voltage according to the target value of the voltage value can be acquired.

Here, if a minimum unit of a value (that is, a minimum increment) that can be set to a PWM signal generation unit is relatively large, the duty ratio of the PWM signals cannot be smoothly changed with respect to changes of the target value, and thus the output voltage changes stepwise. Also, for example, if the target value to be set in the PWM signal generation unit is calculated as an operation amount of the PWM control, when the minimum unit of the value that can be set is larger than the minimum unit of the target value, the duty ratio of the PWM signals cannot be smoothly changed with respect to the change of the target value of the voltage and load variation, and thus an error occurs in the output voltage.

In this regard, JP 3-98470A discloses a PWM inverter in which, when an on/off-time of a PWM signal is computed every PWM control period, the on/off-time is calculated by performing a computation while rounding down the remainder of a division using a voltage command value as a dividend, and a PWM pulse is output based on the calculation result. The remainder that occurs in the above computation corresponds to a voltage command value that is not reflected in the on/off-time and rounded down.

In this PWM inverter, the remainder that has been rounded down is sequentially added to the voltage command value in the computation in the next and subsequent cycles. Thus, the remainder that was not reflected in the on/off-time in the previous computation is reflected in the new on/off-time at the time of the next computation, the remainder at this time is further reflected in the next computation, and this computation is repeated. As a result, the average value of the on/off-time that is to be set for the PWM signal generation unit can be brought closer to a target on/off-time that is to be originally set. That is, the minimum increment of the value set for the PWM signal generation unit can be set smaller than the actual increment in average.

On the other hand, another problem related to the PWM control is a problem of noise caused by fixing the PWM cycle. Frequency spread PWM control has been proposed as a method for reducing this kind of noise, in this frequency spread PWM control, occurrence of noise is suppressed by randomly changing the PWM cycle. As a technique relating to this frequency spread PWM control, there is a technique as disclosed in JP 2010-130850A, for example.

SUMMARY

However, a technique in which a time-division-control method for making the minimum unit of the value set to the generation unit substantially smaller than the actual minimum unit as disclosed in JP 3-98470A and a method for reducing noise by frequency spread as disclosed in JP 2010-130850A are to be combined has not been proposed, and thus, the advantages of both techniques have not been provided together in a conventional technique. Even if the time-division-control technique as disclosed in JP 3-98470A and the frequency spread technique as disclosed in JP 2010-130850A are combined, if these techniques are used together without considering the influence of each other, a situation occurs in which the respective advantages cannot be fully provided. When a duty ratio is adjusted using the time-division-control method as disclosed in JP 3-98470A, if the frequency spread technique is simply combined with it, the target duty ratio is not set as expected because the cycle randomly changes even if the duty ratio is to be finely adjusted with the time-division-control, and thus the advantage of the time-division-control cannot be fully provided.

An exemplary aspect of the disclosure provides a technique in which a cycle of a PWM signal can be changed and a duty ratio of the PWM signal can be brought closer to a target duty ratio.

A vehicle-mounted signal generation circuit that is one example of the present disclosure is a vehicle-mounted signal generation circuit for generating a PWM signal to be provided to a voltage conversion device that outputs an output voltage generated by converting an input voltage with an on/off operation of a switch according to the PWM signal, the vehicle-mounted signal generation circuit includes: an electronic control unit that is configured to: generate the PWM signal for the voltage conversion device; set a target duty ratio, which is a target value of a duty ratio of the PWM signal, based on an output from the voltage conversion device; set a cycle setting value of the PWM signal and to change the cycle setting value set according to passage of time; and set an output duty ratio, which is a value of a duty ratio based on the target duty ratio set and the cycle setting value set. The electronic control unit generates the PWM signal in which the duty ratio is set to the output duty ratio set. When an on-time based on an ideal duty ratio, which is a value in which the target duty ratio set is reflected, and the cycle setting value set is regarded as a first on-time, and a value close to the first on-time that is selected from a plurality of candidate setting values that are defined based on a predetermined resolution is regarded as a second on-time, the electronic control unit is configured: to create a cycle adjusting value such that an adjusted ratio, which is a ratio of the second on-time to the cycle adjusting value acquired by increasing or decreasing the cycle setting value, is brought closer to the ideal duty ratio, and to set the output duty ratio such that the cycle adjusting value serves as a cycle of the PWM signal and the second on-time serves as an on-time of the PWM signal.

A vehicle-mounted power supply device that is another example of the present disclosure includes the above-mentioned vehicle-mounted signal generation circuit, and a voltage conversion device.

In the present prevention, the signal generation circuit has a function of changing the cycle of the PWM signal and can change the cycle without fixing the cycle, and thus noise caused by fixation of the cycle can be reduced.

Furthermore, the electronic control unit creates the cycle adjusting value such that the adjusted ratio (the ratio of the second on-time to the cycle adjusting value acquired by increasing or decreasing the cycle setting value) is to be brought closer to the ideal duty ratio and sets the output duty ratio such that the cycle adjusting value is to be the cycle of the PWM signal and the second on-time is to be an on-time of the PWM signal. In this manner, even if the output duty ratio is set using only the cycle setting value (the value set by the cycle setting unit) and the second on-time (the on-time defined according to the resolution), if deviation between the output duty ratio and the ideal duty ratio becomes large, it is possible to perform fine adjusting of the cycle for increasing or decreasing the cycle setting value, and the ratio (adjusted ratio) after the fine adjustment corresponding to the output duty ratio can be brought closer to the target duty ratio.

BRIEF DESCRIPTION OF THE DRAWINGS

FIG. 7A is an illustrative diagram showing a setting example of an ideal duty ratio, a cycle setting value, and a first on-time.

FIG. 7B is an illustrative diagram illustrating a determination method of a second on-time under the conditions shown in FIG. 7A.

FIG. 8 is an illustrative diagram illustrating an example for obtaining the cycle adjusting value by changing the cycle setting value and for decreasing a difference from an ideal duty ratio.

DETAILED DESCRIPTION OF EMBODIMENTS

Figure 1:
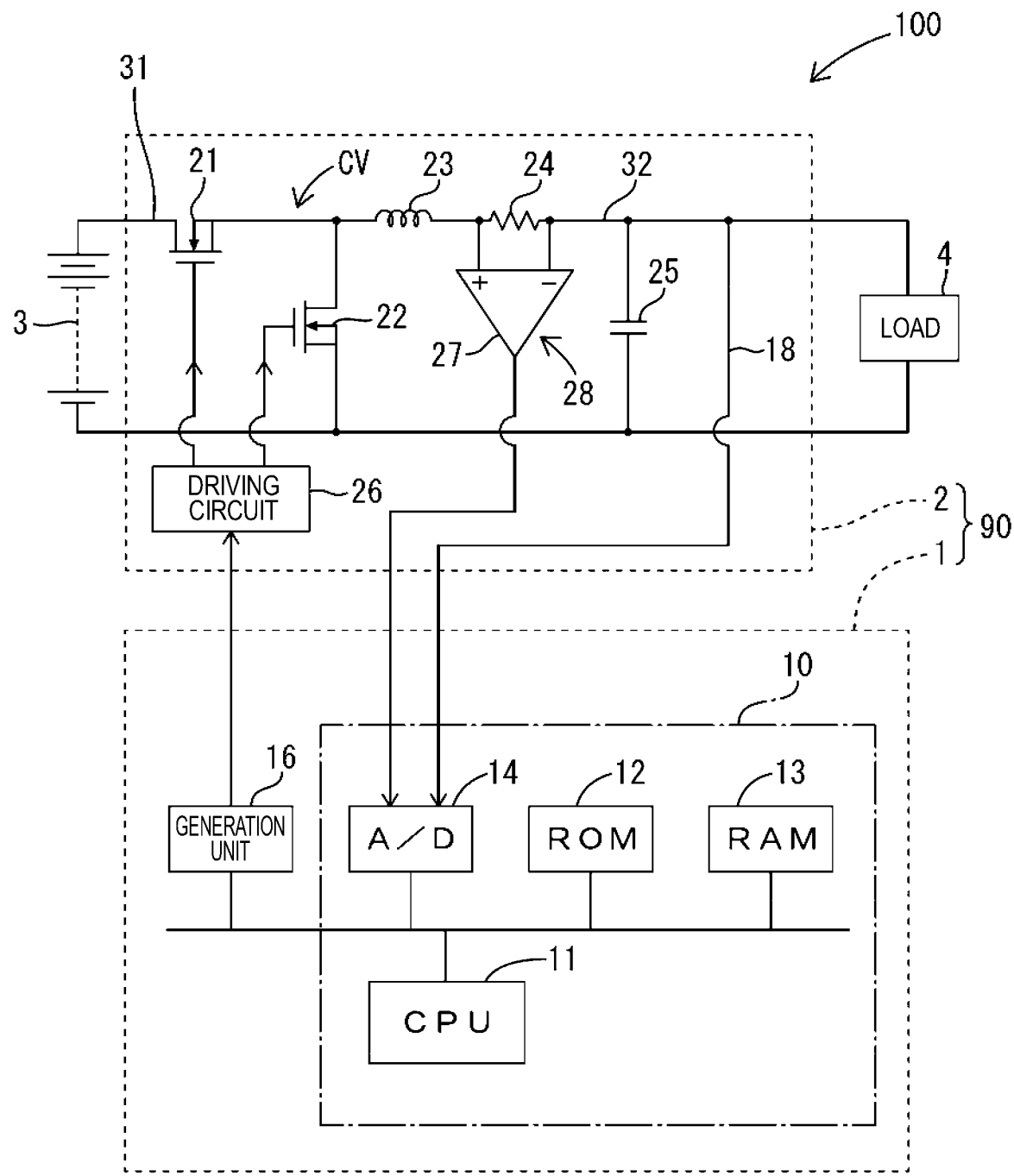
FIG. 1 is a circuit diagram conceptually illustrating a vehicle-mounted power supply system including a vehicle-mounted signal generation circuit according to a first embodiment.

Hereinafter, examples of preferred embodiments of the disclosure will be described.

The signal generation circuit may include a correction value creation unit configured to create a correction value, which is used by the output duty ration setting unit from the next time onward, based on a difference between the target duty ratio set by the target duty ratio setting unit and the output duty ratio set by the output duty ratio setting unit. The output duty ratio setting unit may be configured to set the first time on-time, that is determined based on the ideal duty ratio, which is a value acquired by correcting the target duty ratio set by the target duty ratio setting unit with the correction value that was created by the correction value creation unit up to the last time and the cycle setting value set by the cycle setting unit.

In this manner, it is possible to bring the output duty ratio closer to the target duty ratio each time, and it is also possible to reflect a portion of the target duty ratio that was not reflected in the output duty ratio in the output duty ratio from the next time onward, and thus accuracy increases through multiple creation processes.

The output duty ratio setting unit may be configured to set an added value, which is acquired by adding the correction value created by the correction value creation unit at the last time to the target duty ratio, as an ideal duty ratio, to set a multiplication value acquired by multiplying the ideal duty ratio by the cycle setting value as the first on-time, and to set a value closest to the first on-time that is selected from the multiple candidate setting values as the second on-time.

In this manner, it is possible to more reliably reflect a portion of the target duty ratio that was not reflected in the output duty ratio in the output duty ratio from the next time onward.

The output duty ratio setting unit may operate so as to set, if a difference between a reference ratio, which is a ratio of the second on-time to the cycle setting value, and the ideal duty ratio is less than a predetermined value, the reference ratio as the output duty ratio, if the difference between the reference ratio and the ideal duty ratio is larger than or equal to the predetermined value, to create the cycle adjusting value and set an output duty ratio in which that cycle adjusting value is the cycle of the PWM signal and the second on-time is the on-time of the PWM signal.

In this manner, if the difference between the reference ratio and the ideal duty ratio is small, the reference ratio can be set as it is as the output duty ratio, and thus the output duty ratio in which the target duty ratio is reflected with high accuracy can be rapidly created. On the other hand, if the difference between the reference ratio and the ideal duty ratio is large, the cycle adjusting value is created by increasing or reducing the cycle setting value, and thus the adjusted ratio close to the ideal duty ratio can be acquired. Accordingly, even if the difference between the reference ratio and the ideal duty ratio is large, it is possible to prevent the situation in which an output duty ratio greatly deviating from the ideal duty ratio is set.

The cycle setting unit may be configured to set the cycle setting value such that a value is selected from multiple candidate setting values determined with a first cycle interval. The output duty ratio setting unit may be configured to create the cycle adjusting value by changing the cycle setting value set by the cycle setting unit with a second cycle interval that is shorter than the first cycle interval.

In this manner, the cycle adjusting value can be acquired with a method in which the cycle setting value set by the cycle setting unit is more finely changed, and thus it is easier to acquire the cycle adjusting value that is more desirable for bringing the adjusted ratio closer to the ideal duty ratio.

In the present disclosure, "a predetermined resolution" means "a resolution of an on-time that can be set", specifically, it means the fineness (granularity) by which the signal generation circuit can change an on-time. If the resolution is large, the minimum unit by which the generation unit can change the on-time becomes large. On the other hand, if the resolution is small, the minimum unit by which the generation unit can change the on-time becomes small. In the present disclosure, "a value close to the first on-time is set to the second on-time, the value being selected from multiple candidate setting values determined based on the predetermined resolution" means that the on-time close to the first on-time is selected from the on-time that the generation unit can output (the on-time that can be switched according to the resolution).

First Embodiment

The following will describe a first embodiment of the present disclosure.

A vehicle-mounted power supply system 100 shown in FIG. 1 mainly includes a vehicle-mounted power supply device 90 (hereinafter, also referred to "power supply device 90") constituted by a signal generation circuit 1 and a voltage conversion device 2, a battery 3 serving as a power supply unit, a load 4 to which power is supplied, and the vehicle-mounted power supply system 100 is configured as a vehicle-mounted power supply system that supplies the power to the vehicle-mounted load 4 based on the power supplied from the battery 3.

The battery 3 is constituted by a known electric storage means such as a lead storage battery and generates a predetermined voltage. A terminal at a high potential side of the battery 3 is electrically connected to a first conduction path 31, and a terminal at a low potential side of the battery 3 is electrically connected to ground, for example.

The voltage conversion device 2 has the function of creating an output voltage by converting an input voltage by on/off operation of switches 21 and 22 according to the PWM signal. The voltage conversion device 2 is electrically connected to the external battery 3 and the load 4, and has the function of stepping down a DC voltage supplied from the battery 3 and supplying the stepped-down voltage to the load 4. This voltage conversion device 2 includes a converter CV that steps down a DC voltage, a driving circuit 26 that drives the converter CV, a capacitor 25 that smooths the voltage stepped down by the converter CV, and a current detection circuit 28 for detecting an output current. The output current from the converter CV is supplied to the load 4 via the current detection circuit 28, and a voltage supplied to the load 4 is provided to the signal generation circuit 1.

The converter CV, which is a so-called single-phase converter, is provided between the first conduction path 31 and a second conduction path 32. The converter CV includes the switches 21 and 22 and an inductor 23, and performs voltage conversion by switching operation of the switches 21 and 22. The switch 21 on the high-side is constituted by, for example, a semiconductor switching element, and in the example shown in FIG. 1, it is an N-channel MOSFET in which a DC voltage supplied from the battery 3 (a DC voltage applied to the first conduction path 31) is applied to the drain. The switch 22 on the low-side is constituted by, for example, a semiconductor switching element, and in the example shown in FIG. 1, it is constituted by an N-channel MOSFET. The drain of the switch 22 is electrically connected to a node connecting the switch 21 and the inductor 23, and the source of the switch 22 grounded. One end of the inductor 23 is electrically connected to the capacitor 25, and the other end of it is electrically connected to the source of the switch 21.

The first conduction path 31 serving as a conduction path on the input side is connected to the drain of the high-side switch 21, and the drain of the low-side switch 22 and the one end of the inductor 23 are electrically connected to the source of the switch 21. A driving signal (on signal) and a non-driving signal (off signal) provided from the driving circuit 26 are input to the gate of the switch 21, and the switch 21 is configured to be switched between on and off in response to the signal provided from the driving circuit 26. In the same manner, a driving signal (on signal) and a non-driving signal (off signal) provided from the driving circuit 26 are input to the gate of the switch 22, and the switch 22 is configured to be switched between on and off in response to the signal provided from the driving circuit 26.

Based on the PWM signal provided from a generation unit 16, the driving circuit 26 applies, to the gates of the switches 21 and 22, an on signal for alternately turning on the switches 21 and 22 at respective control cycles. An on signal whose phase is inverted with respect to the on signal that is provided to the gate of the switch 22 while securing a so-called dead time is provided to the gate of the switch 21.

The signal generation circuit 1 constitutes a portion of the power supply device 90, and is configured to generate PWM signals to be provided to the voltage conversion device 2 in the power supply device 90. The signal generation circuit 1 is configured as a circuit that selects the on-time of the PWM signals to be output to the voltage conversion device 2 from multiple predetermined settable values, based on the set target value (a target on-time to that is described later), and can set the on-time to the selected on-time. The details of the signal generation circuit 1 are described later.

A control unit 10 includes a microcomputer having a CPU 11. The CPU 11 is connected, via a bus, to a ROM 12 that stores information such as a program, a RAM 13 that temporarily stores generated information, an A/D converter 14 that converts an analog voltage to a digital value. The CPU 11 is also connected to the generation unit 16 via the bus. A detection voltage provided from the current detection circuit 28 and an output voltage to be supplied to the load 4 are provided to the A/D converter 14. In this configuration, the current detection circuit 28 and a path 18 through which a voltage is input to the A/D converter 14 constitute an output detection unit, whose function is to detect an output current and an output voltage from the converter CV (voltage conversion unit). Note, that in the example shown in FIG. 1, the path 18 is configured to input a voltage of the second conduction path 32 on an output side to the A/D converter 14, but it may also be configured to input a voltage acquired by dividing a voltage of the second conduction path 32 to the A/D converter 14.

The generation unit 16 is configured as a known PWM signal generation circuit, and creates PWM signals having a cycle and an on signal set by the control unit 10. The generation unit 16 includes, for example, an internal clock (not shown) and creates PWM signals having an on-time that is an integral multiple of the cycle of the internal clock. The PWM signals created by the generation unit 16 are provided to the driving circuit 26.

The current detection circuit 28 has a resistor 24 and a differential amplifier 27. A voltage decrease across the resistor 24 caused by the output current flowing from the converter CV is amplified by the differential amplifier 27 and becomes a detection voltage that is in accordance with the output current. This detection voltage is converted to a digital value by the A/D converter 14.

The voltage conversion device 2 configured in this manner functions as a step-down converter using synchronous rectification, switches the low-side switch 22 on and off in synchronization with the operation of the high-side switch 21, steps down a DC voltage applied to the first conduction path 31, and applies the stepped-down output voltage to the second conduction path 32. "DC voltage applied to the first conduction path 31" is an input voltage that is input to the converter CV. More specifically, it is a potential difference between a potential at the first conduction path 31 and a predetermined reference potential (ground potential). "DC voltage applied to the second conduction path 32" is an output voltage that is output from the converter CV. Specifically, it is a potential difference between a potential at the second conduction path 32 and the predetermined reference potential (ground potential). In the voltage conversion device 2 shown in FIG. 1, by PWM signals complementarily supplied from the driving circuit 26 to the gates of the switches 21 and 22, the first state in which the switch 21 is in the on state and the switch 22 is in the off state and the second state in which the switch 21 is in the off state and the switch 22 is in the on state are alternately switched while setting the dead time, and, by this operation, the DC voltage applied to the first conduction path 31 is stepped down and the stepped-down voltage is output to the second conduction path 32. The output voltage to the second conduction path 32 depends on the duty ratio of the PWM signals to be provided to the gate of the switch 21.

Next, the details of the signal generation circuit 1 are described.

In the power supply device 90 (control device) including the voltage conversion device 2 (control target unit) whose output is controlled by the PWM signals, the signal generation circuit 1 is configured as a circuit that generates the PWM signals to be provided to the voltage conversion device 2.

Figure 2:
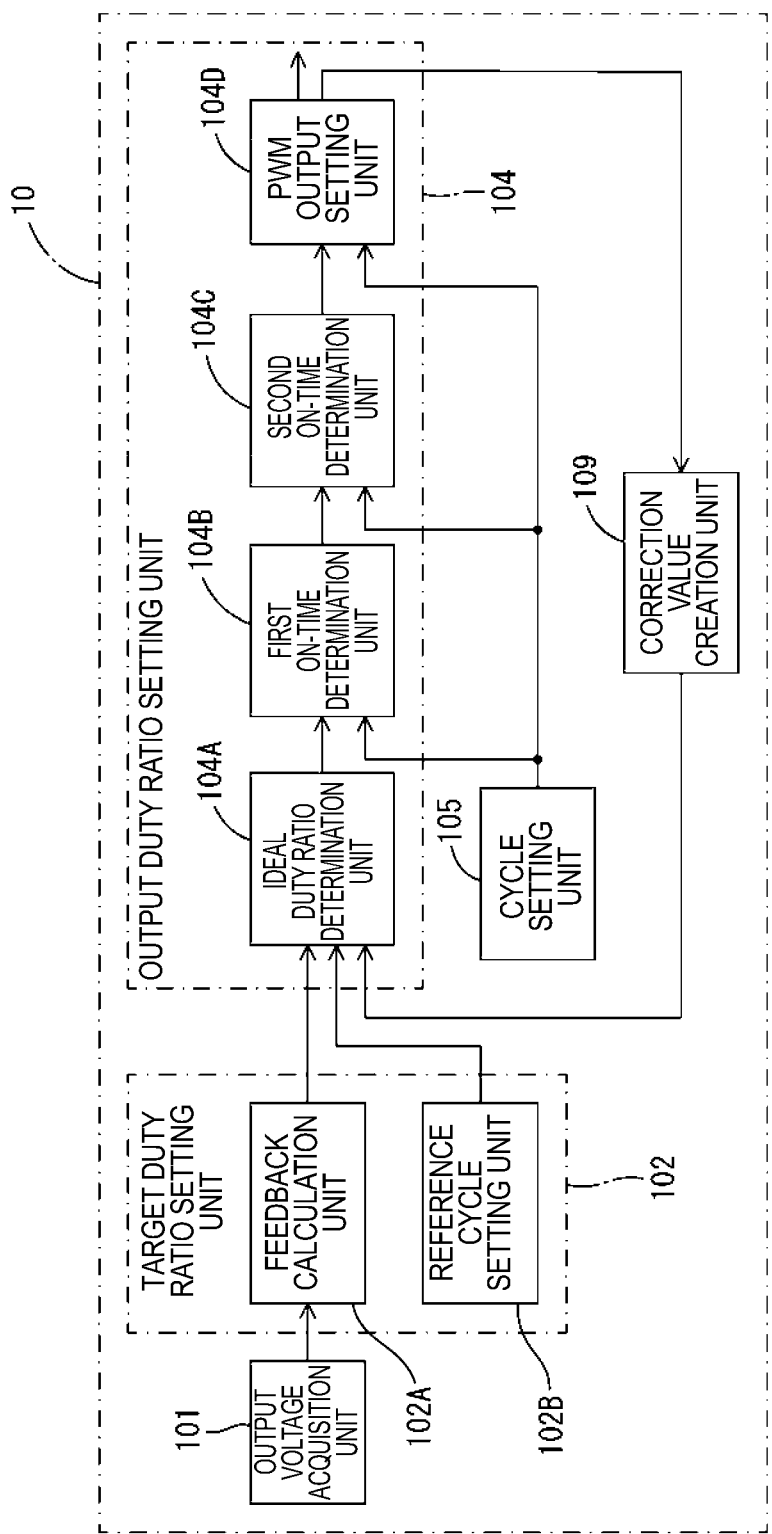
FIG. 2 is a function block diagram conceptually showing each function of the vehicle-mounted signal generation circuit according to the first embodiment.
Figure 3:
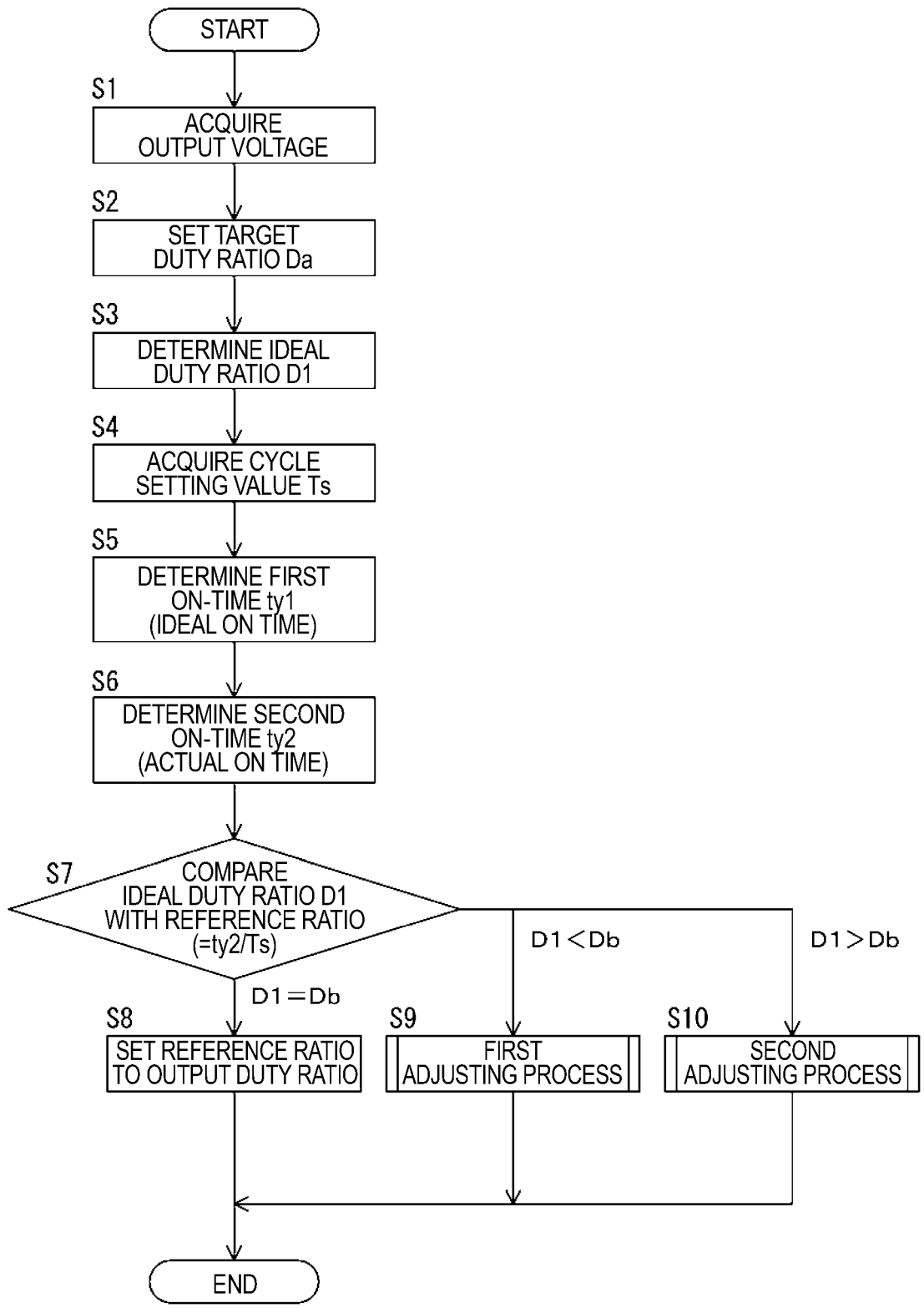
FIG. 3 is a flowchart illustrating a flow of output duty ratio setting control performed by the vehicle-mounted signal generation circuit according to the first embodiment.

The control unit 10 of the signal generation circuit 1 has the functions shown in FIG. 2, and performs arithmetic control with the flow shown in FIG. 3. The arithmetic control shown in FIG. 3 is performed by the control unit 10, at every single cycle of the PWM signals, for example.

As shown in FIG. 3, when control in FIG. 3 is performed every cycle of the PWM signals, the output voltage that is applied to the conduction path (the second conduction path 32) on the output side of the voltage conversion device 2 is acquired in step S1. The function of an output voltage acquisition unit 101 is, specifically, performed by the A/D converter 14 and the CPU 11, and a value of the voltage (output voltage) that is applied to the second conduction path 32 is acquired. This output voltage is temporarily stored in a storage unit in the control unit 10.

After the voltage applied to the second conduction path 32 (output voltage V2) in step S1 shown in FIG. 3 is acquired, a process of step S2 is performed, and a target duty ratio Da is set. A target duty ratio setting unit 102 shown in FIG. 2 is a portion for realizing a function of step S2. More specifically, the control unit 10 (or, the control unit 10 and storage means) functions as the target duty ratio setting unit 102, and sets the target duty ratio Da, which is a target value of the duty ratio of the PWM signals, according to the output from the voltage conversion device 2. The target duty ratio Da is ta/Tb, which is the ratio of the target on-time ta to a predetermined reference cycle Tb, and in step S2, the reference cycle Tb and the target on-time ta are specified as values for determining the target duty ratio Da. The reference cycle Tb is a predetermined fixed value that has been set by a reference cycle setting unit 102B. The reference cycle setting unit 102B may have a configuration that can hold the reference cycle Tb as a fixed value, and is realized by a storage unit such as the ROM 12. Because the reference cycle Tb is a fixed value, if the target on-time ta is determined, the target duty ratio Da is also set. Accordingly, in step S2, the target on-time ta is calculated.

In step S2, based on the output value V2 acquired in step S2 and a predetermined target voltage Vt, the control unit 10 calculates an operation amount (target on-time ta) using a known feedback calculation. The function of a feedback calculation unit (PID calculation unit) 102A (shown in FIG. 2) that performs the process of step S2 is, specifically, performed by the CPU 11. The CPU 11 functions as a feedback calculation unit that sets the operation amount based on the output from the voltage conversion device 2. In this example, the output voltage corresponds to a control amount in the PID control, and the on-time corresponds to an operation amount in the PID control. More specifically, based on a deviation between the output voltage V2 that is applied to the second conduction path 32 and the predetermined target voltage Vt, a feedback calculation is performed with a known PID calculation, and the on-time serving as a target in the next cycle (target on-time ta) is set as an operation amount. There is no limitation to setting a proportional gain, a differential gain, and an integral gain when the feedback calculation is performed by PID control and various values can be set. Obtaining the operation amount (target on-time ta) and the reference cycle Tb in this manner is "setting of the target duty ratio Da" in step S2.

After step S2 shown in FIG. 3, the process of step S3 is performed, and the ideal duty ratio D1 is determined. An ideal duty ratio determination unit 104A shown in FIG. 2 is a portion for realizing the function of step S2. Specifically, the control unit 10 functions as the ideal duty ratio determination unit 104A and determines the ideal duty ratio D1. The ideal duty ratio D1 is an ideal duty ratio acquired by reflecting the target duty ratio Da set by the target duty ratio setting unit 102. Specifically, it is a value acquired by correcting the target duty ratio Da with a correction value Df generated by a correction value creation unit 109 up to the last time (more specifically, an added value (Da+Df) acquired by adding the correction value Df created by the correction value creation unit 109 at the last time to the target duty ratio Da). The ideal duty ratio determination unit 104A performs the process of step S3 every single cycle of PWM signals, and calculates a value, which is acquired by adding the duty ratio Da (the value ta/Tb acquired by dividing the latest target on-time ta set by the feedback calculation unit 102A by the reference cycle Tb) and the latest correction value Df that has been determined by the correction value creation unit 109 (the remainder of the previous cycle), as the ideal duty ratio D1. That is, the ideal duty ratio D1 is calculated every single cycle of the PWM signals using the arithmetic expression D1=ta/Tb+Df.

After step S3 shown in FIG. 3, the process in step S4 is performed, and a cycle setting value Ts is acquired. The cycle setting unit 105 shown in FIG. 2 is a portion for realizing the function of step S4. Specifically, the CPU 11 and the storage unit (the ROM 12, for example) function as the cycle setting unit 105. In the cycle setting unit 105, multiple cycles, which are cycles that can be set by the generation unit 16 and are cycles within a predetermined cycle range, are prepared as candidates, and a cycle is randomly selected from these multiple cycles. Data in which the multiple cycles, which are cycles that can be set by the generation unit 16 and cycles within the predetermined cycle range, are tabled (frequency spread table) is stored in the ROM 12, and the CPU 11 randomly selects a cycle from the frequency spread table in the process of step S4 that is performed every cycle. The selected cycle value is held in the storage unit (in the RAM 13, for example) as the cycle setting value Ts. The cycle setting value Ts is a value to be reflected in the actual cycle of the next PWM signals that are newly generated. When the predetermined first condition is met, the cycle setting value serves, as it is, as an actual cycle, and when the predetermined second condition is met, a value acquired by finely adjusting the cycle setting value Ts with a later-described method (the methods shown in FIGS. 4 and 5, for example) serves as the actual cycle. As described above, the cycle setting unit 105 has a function of setting the cycle setting value Ts. Furthermore, it functions to change the cycle setting value Ts according to the passage of time. In the example shown in FIG. 3, the process in step S4 is performed every single cycle of the PWM signals, and the value of the cycle setting value Ts is updated each time the process in step S4 is performed.

After step S4 shown in FIG. 3, the process of step S5 is performed, and a first on-time ty1 (ideal on-time) is determined. A first on-time determination unit 104B shown in FIG. 2 is a portion for realizing a function of step S5. Specifically, the CPU 11 functions as the first on-time determination unit 104B. The first on-time ty1 is an ideal on-time to acquire the ideal duty ratio D1 when the cycle setting value Ts is set, and it is an on-time based on the ideal duty ratio D1 and the cycle setting value Ts (more specifically, it is a multiplied value acquired by multiplying the ideal duty ration D1 by the cycle setting value Ts (D1×Ts)). The first on-time determination unit 104B performs the process of step S5 every single cycle of the PWM signals, and determines the first on-time ty1 (the ideal on-time) by multiplying the ideal duty ratio D1 determined in step S3 (a value acquired by adding a value acquired by dividing the latest target on-time to set by the feedback calculation unit 102A by the reference cycle Tb and the latest correction value Df (the previous remainder) having been determined by the correction value creation unit 109) by the latest cycle setting value Ts determined by the cycle setting unit 105. That is, the first on-time ty1 is acquired by performing the calculation ty1=Ts×D1 in step S5 every single cycle of the PWM signals.

In this manner, the ideal duty ratio determination unit 104A and the first on-time determination unit 104B perform the processes of steps S3 and S5 every single cycle of PWM signals, and determine the first on-time ty1 based on the latest ideal duty ratio D1 and the latest cycle setting value Ts.

After step S5 shown in FIG. 3, the process of step S6 is performed, and a second on-time ty2 (actual on-time) is determined. A second on-time determination unit 104C shown in FIG. 2 is a portion for realizing the function of step S6. Specifically, the CPU 11 functions as the second on-time determination unit 104C and determines the second on-time ty2 (actual on-time) based on the first on-time ty1 (ideal on-time) and a PWM resolution. The second on-time ty2 is a value close to the first on-time ty1, the value being selected from the multiple candidate setting values that are determined based on the resolution (predetermined resolution) for setting the on-time in the signal generation circuit 1 (more specifically, a value closest to the first on-time ty1, the value being selected from the multiple candidate setting values). The second on-time determination unit 104C performs the process of step S6 every single cycle of the PWM signals, and determines the candidate setting value close to the latest first on-time determined by the first on-time determination unit 104B as the second on-time ty2, the candidate setting value being selected from the multiple setting values that are values of on-time that the generation unit 16 can output. The candidate setting value in this description means an integral multiple value of a minimum unit (minimum increment) to be reflected in a change in the output PWM signal when set in the generation unit 16. The minimum unit at this time is the resolution, which means a settable on-time interval. Specifically, the on-time of PWM signals that the generation unit 16 outputs is to be selected from the integral multiple values of the above-mentioned minimum unit (candidate setting values). The second on-time determination unit 104C determines, from the multiple predetermined setting candidate values larger than or equal to or smaller than or equal to the latest first on-time ty1 determined by the first on-time determination unit 104B, the candidate setting value closest to the latest first on-time as the second on-time ty2.

After step S6 shown in FIG. 3, the processes in steps S7 to S10 are performed, and setting of the output duty ratio is performed. A PWM output setting unit 104D is a portion for realizing the functions of steps S7 to S10. Specifically, the CPU 11 functions as the PWM output setting unit 104D and sets the output duty ratio, which is a value of a duty ratio actually used for the PWM signals, based on the target duty ratio Da set by the target duty ratio setting unit and the cycle setting value set by the cycle setting unit. The CPU 11 functioning as the PWM output setting unit 104D firstly performs the process of step S7, and compares the ideal duty ratio D1 with the reference ratio Db. The reference ratio Db is ty2/Ts, which is a ratio of the second on-time ty2 to the cycle setting value Ts. That is, Db=ty2/Ts. In step S7, the CPU 11 compares D1 with Db, and then, if D1=Db, the CPU 11 performs the process of step S8, if D1<Db, it performs the process of step S9, and if D1>Db, it performs the process of step S10.

If determining that D1=Db in step S7, the CPU 11 (PWM output setting unit 104D) sets the reference ratio Db (ty2/Ts) to the output duty ratio Dr in step S8. The case of D1=Db is a case in which the duty ratio at the time of the cycle of the cycle setting value Ts and the on-time of the second on-time ty2 being set coincides with the ideal duty ratio D1. In this case, if the PWM signals are created with the cycle of the cycle setting value Ts and the on-time of the second on-time ty2, there is no error between that duty ratio (reference ratio) and the ideal duty ratio D1, and thus the reference ratio is set as the output duty ratio. In this case, the cycle of the PWM signals is updated to Ts, the on-time of the PWM signals is updated to ty2, and each of the values is stored in the storage unit and the like. If the cycle of the PWM signals is updated to Ts and the on-time of the PWM signals is updated to ty2 by the CPU 11 (PWM output setting unit 104D), the generation unit 16 sets the cycle to Ts and sets the on-time to ty2, and then generates the PWM signals whose output duty ratio Dr is set to the reference ratio Db (ty2/Ts). Note, that the generation unit 16 is configured to reflect the cycle and the second on-time stored in the storage unit and the like every single cycle of the PWM signals (the latest cycle and the on-time (the second on-time) set by the output duty ratio setting unit 104) and configured to generate the PWM signals.

Also, in step S8, if the reference ratio Db (ty2/Ts) is set to the output duty ratio Dr, the correction value Df is updated to zero at the correction value creation unit 109. In this case, the correction value Df used for creating the ideal duty ratio D1 in step S3 at the next time becomes zero. Note, that in steps S7 and S8, not only the case where the difference between the ideal duty ratio D1 and the reference ratio Db is perfectly zero but also the case where the difference between the ideal duty ratio D1 and the reference ratio Db is less than a predetermined value (a minute value larger than zero) can be considered as D1=Db.

Next, the first adjusting process shown in FIG. 3 will be described. If determining D1<Db in step S7, the CPU 11 (PWM output setting unit 104D) performs the first adjusting process shown in FIG. 4 in step S9. In the adjusting process shown in FIG. 4, multiple changed cycles Tr are acquired by increasing the cycle setting value Ts in a predetermined increase range, and then, from the acquired multiple changed cycles Tr, a value at which a change ratio Dc (ty2/Tr) is closest to the ideal duty ratio D1 is acquired. Specifically, first, N=1 in step S21. Next, in step S22, the changed cycle Tr at the time of the current value of N is calculated by Tr=Ts+N×D2, and then the change ratio DC at that time is calculated as Dc=Ty2/Tr. Then, in step S23 following step S22, the CPU 11 (PWM output setting unit 104D) determines whether the current value of N is a maximum value Nmax, and if the current value of N is less than the maximum value Nmax, the CPU 11 performs the process of adding 1 to N and setting a new N (incrementing N) in step S24. After step S24, the CPU 11 returns to step S22 and performs the processes from step S22 onwards. In this manner, the value of N is sequentially changed from 1 to Nmax, the changed cycle and the change ratio for each value of N is acquired.

If determining that the current value of N is the maximum value Nmax in step S23 (in the case of "Yes" in step S23), the CPU 11 (PWM output setting unit 104D) specifies the change ratio closest to the ideal duty ratio D1 from the multiple change ratios Dc (ty2/Tr) acquired by sequentially changing the value of N from 1 to Nmax, and selects the changed cycle at that change ratio as the cycle adjusting value Tx (step S25). In this manner, the cycle adjusting value Tx is created such that an adjusted ratio Dg (ty2/Tx: the ratio of the second on-time ty2 to the cycle adjusting value Tx acquired by increasing the cycle setting value Ts) is brought closer to the ideal duty ratio D1.

After step S25, the CPU 11 (PWM output setting unit 104D) sets the cycle adjusting value Tx to the cycle of PWM signals, sets the second on-time ty2 to the on-time of the PWM signals, and sets the adjusted ratio Dg (ty2/Tx: the ratio of the second on-time ty2 to the cycle adjusting value Tx acquired by increasing the cycle setting value Ts) to the output duty ratio Dr (step S26). In this case, the cycle of the PWM signals is updated to Tx, the on-time of PWM signals is updated to ty2, and each of the values is stored in the storage unit and the like.

In this manner, if in the case of D1<Db, that is, if the difference between the reference ratio Db (ty2/Ts) and the ideal duty ratio is larger than or equal to the predetermined value and the reference ratio Db is larger than the ideal duty ratio D1, the CPU 11 (PWM output setting unit 104D) creates the cycle adjusting value Tx, and sets the output duty ratio in which the cycle adjusting value Tx is the cycle of the PWM signals and the second on-time ty2 is the on-time of the PWM signals. Then, the generation unit 16 generates the PWM signals in which the cycle is Tx, the on-time is ty2, and the output duty ratio Dr is the adjusted ratio Dg (ty2/Tx).

Furthermore, after step S26, the process of step S27 is performed. The correction value creation unit 109 shown in FIG. 2 is a portion for realizing a function of step S26. Specifically, the CPU 11 and the storage units (RAM 13, for example) function as the correction value creation unit 109. The CPU 11 (correction value creation unit 109) performs one of the processes of steps S8 to S10 every single cycle of the PWM signals, and determines the correction value Df used at the ideal duty ratio determination unit 104A at the next time based on the latest target on-time to set by the feedback calculation unit 102A, the reference cycle Tb, the latest correction value Df set in steps S8 to S10 of the previous cycle, the latest value of the cycle Ts set by the cycle setting unit 105, and the latest second on-time ty2 determined by the second on-time determination unit 104C. Note that if the process of step S8 is performed as described above, the correction value Df is updated to zero.

If the correction value is created in step S27, the CPU 11 (correction value creation unit 109) sets the correction value Df to the difference (the remainder) between the ideal duty ratio D1 determined in the previous step S3 and the output duty ratio Dr set in the previous step S26. That is, Df=D1−Dr. The correction value Df (the difference (the remainder) of the duty ratios) that is calculated in this manner is stored in the storage units (RAM 13, for example) as the latest correction value, and serves as the correction value used at the ideal duty ratio determination unit 104A in the next calculation (next cycle) of step S3.

Next, a second adjusting process shown in FIG. 3 will be described. If it is determined that D1>Db in step S7 shown in FIG. 3, the CPU 11 (PWM output setting unit 104D) performs the second adjusting process shown in FIG. 5 in step S10. The second adjusting process shown in FIG. 5 is basically similar to the first adjusting process shown in FIG. 4, and only the determination method of the changed cycle Tr in step S32 is different from that of the first adjusting process shown in FIG. 4. In the second adjusting process shown in FIG. 5, multiple changed cycles Tr acquired by decreasing the cycle setting value Ts within a predetermined increase range are acquired, and then, from the acquired multiple changed cycles Tr, a value at which the change ratio Dc (ty2/Tr) is closest to the ideal duty ratio D1 is acquired.

In the process in FIG. 5, it is assumed that N=1 in step S31. In step S32, the changed cycle Tr at the current value of N is set to Tr=Ts−N×D2, and the change ratio DC at that time is calculated as Dc=ty2/Tr. In step S33 following step S32, the CPU 11 (PWM output setting unit 104D) determines whether the current value of N is the maximum value Nmax, and if the current value of N is less than the maximum value Nmax, the CPU 11 performs the process of adding 1 to N and setting a new N (incrementing N) in step S34. After step S34, the CPU 11 returns to step S32 and performs the processes from step S32 onwards. In this manner, the value of N is sequentially changed from 1 to Nmax, the changed cycle and the change ratio for each value of N are acquired.

If determining that the current value of N is the maximum value Nmax in step S33 (in the case of "Yes" in step S33), the CPU 11 (PWM output setting unit 104D) specifies the change ratio closest to the ideal duty ratio D1 from the multiple change ratios Dc (ty2/Tr) acquired by sequentially changing the value of N from 1 to Nmax, and selects the changed cycle at that change ratio as the cycle adjusting value Tx (step S35). In this manner, the cycle adjusting value Tx is created such that the adjusted ratio Dg (ty2/Tx: the ratio of the second on-time ty2 to the cycle adjusting value Tx acquired by decreasing the cycle setting value Ts) is brought closer to the ideal duty ratio D1. After step S35, the CPU 11 (PWM output setting unit 104D) sets the cycle adjusting value Tx to the cycle of the PWM signals, sets the second on-time ty 2 to the on-time of the PWM signals, and sets the adjusted ratio Dg (ty2/Tx: the ratio of the second on-time ty2 to the cycle adjusting value Tx) as the output duty ratio Dr (step S36). In this case, the cycle of the PWM signals is updated to Tx, the on-time of PWM signals is updated to ty2, and each of the values is stored in the storage unit or the like.

In this manner, if in the case of D1>Db, that is, if the difference between the reference ratio Db (ty2/Ts) and the ideal duty ratio is larger than or equal to the predetermined value and the reference ratio Db is smaller than the ideal duty ratio D1, the CPU 11 (PWM output setting unit 104D) creates the cycle adjusting value Tx, and sets the output duty ratio in which the cycle adjusting value Tx is the cycle of the PWM signals and the second on-time ty2 is the on-time of the PWM signals. Then, the generation unit 16 generates the PWM signals in which the cycle is Tx, the on-time is ty2, and the output duty ratio Dr is the adjusted ratio Dg (ty2/Tx).

Furthermore, after step S36, the process of step S37 is performed. If the correction value is created in step S37, the CPU 11 (correction value creation unit 109) sets the correction value Df to the difference (the remainder) between the ideal duty ratio D1 determined in the previous step S3 and the output duty ratio Dr set in the previous step S36. That is, Df=D1−Dr. The correction value Df (the difference (the remainder) of duty ratios) that was calculated in this manner is stored in the storage unit (RAM 13, for example) as the latest correction value, and it is the correction value used at the ideal duty ratio determination unit 104A in the next calculation of step S3 (next cycle).

Figure 6:
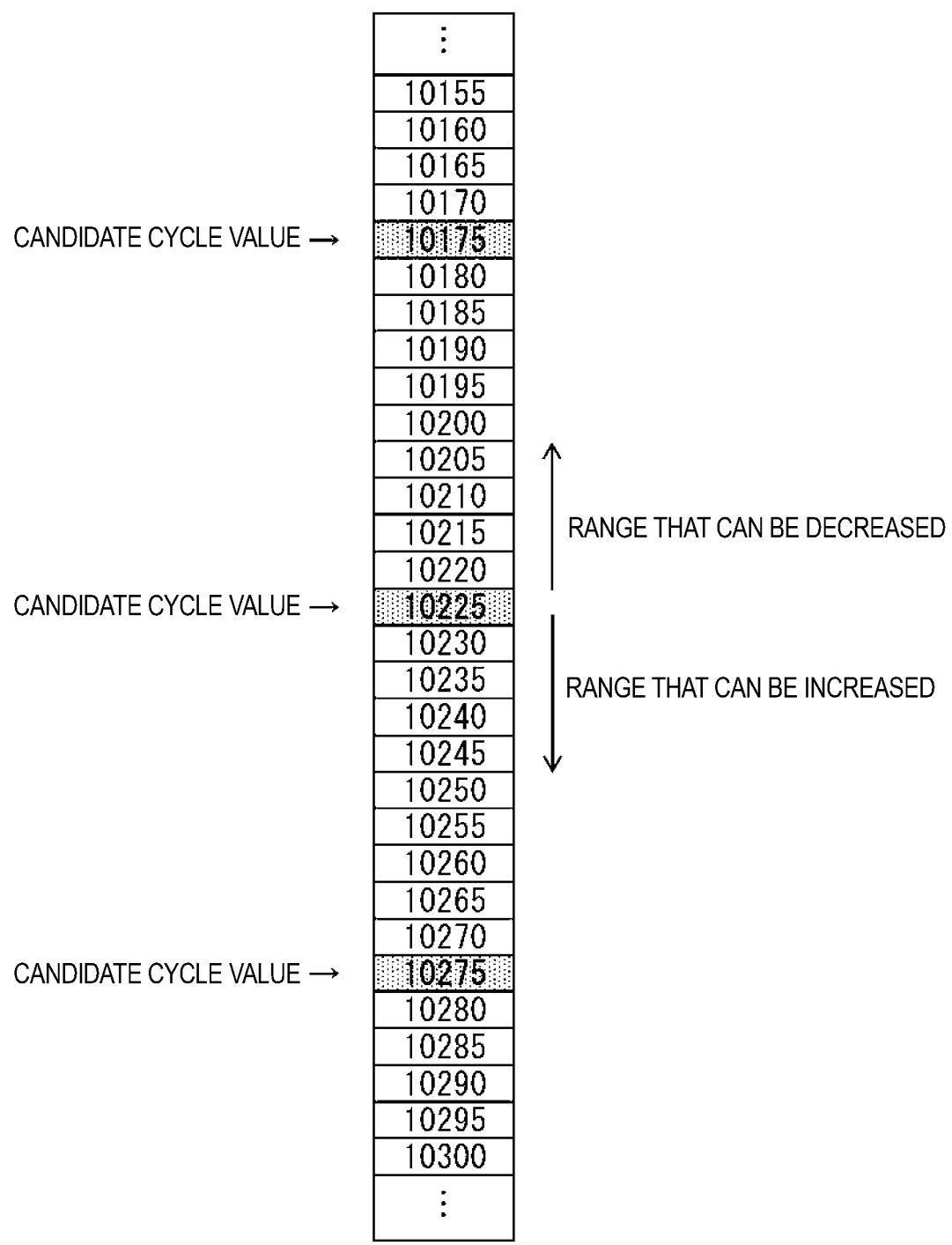
FIG. 6 is an illustrative diagram illustrating setting example of a candidate cycle value and a cycle that can be changed using the candidate cycle values.

FIGS. 6 to 8 are illustrative diagrams illustrating specific examples of the above-described control. In this configuration, if the cycle setting unit 105 shown in FIG. 2 sets the cycle setting value Ts, the cycle setting value Ts is to be set by selecting one of the multiple candidate cycle values defined with the first cycle interval. In the example shown in FIG. 6, the first cycle interval is 50 ns, and the candidate cycle values are determined with 50 ns increments, such as 10175 ns, 10225 ns, and 10275 ns. The cycle setting unit 105 has a cycle table in which these multiple candidate cycle values are tabled. A random number creation unit that randomly selects any of the multiple candidate cycle values, at the timing at which the process of step S4 is performed, selects one of the multiple candidate cycle values that have been determined in this manner and sets that value as the cycle setting value Ts. Also, the cycle setting unit 105 sets new candidate cycle values every time at which the process of step S4 is performed, and updates the cycle setting value Ts.

Figure 4:
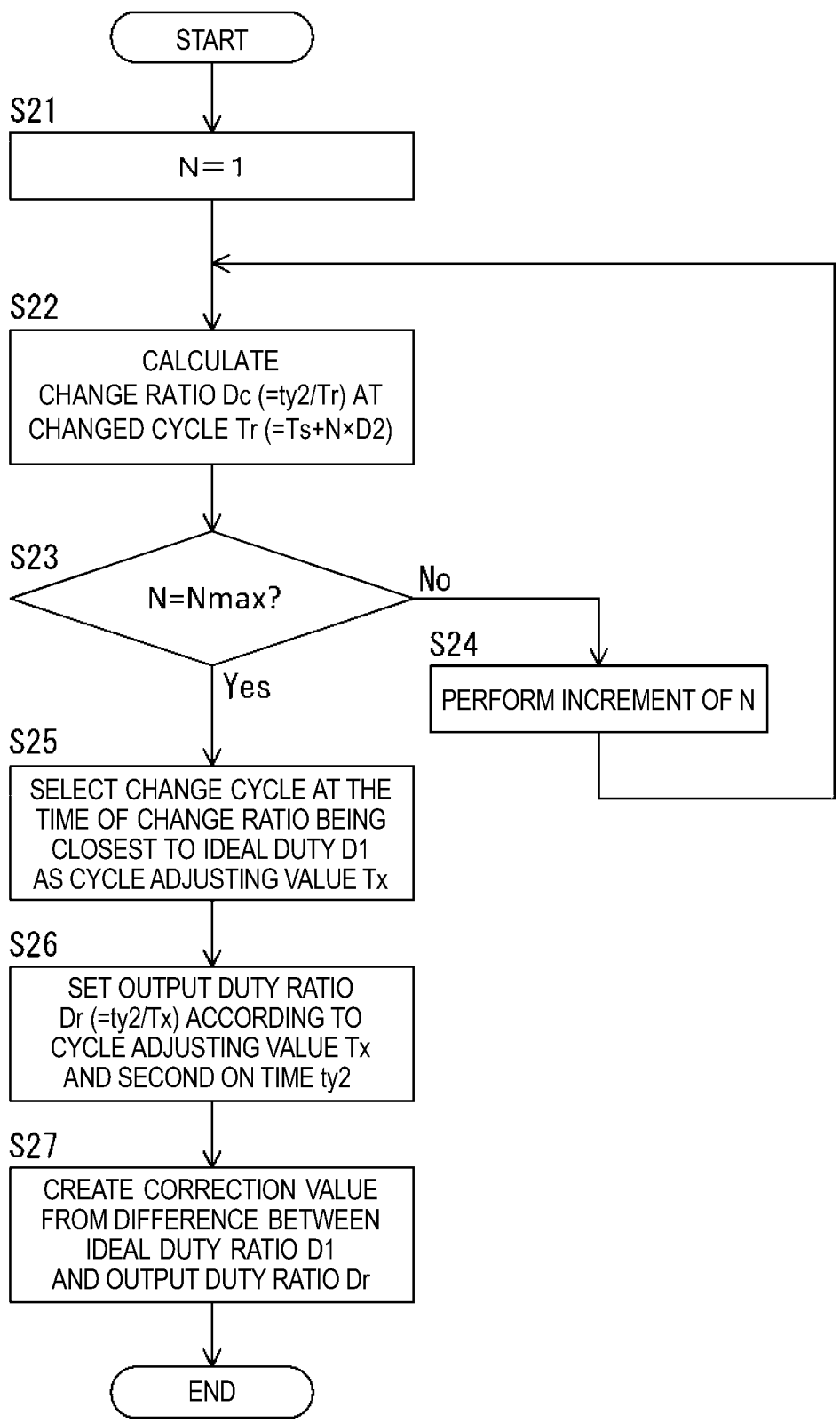
FIG. 4 is a flowchart illustrating a flow of a first adjusting process in the output duty ratio setting control shown in FIG. 3.
Figure 5:
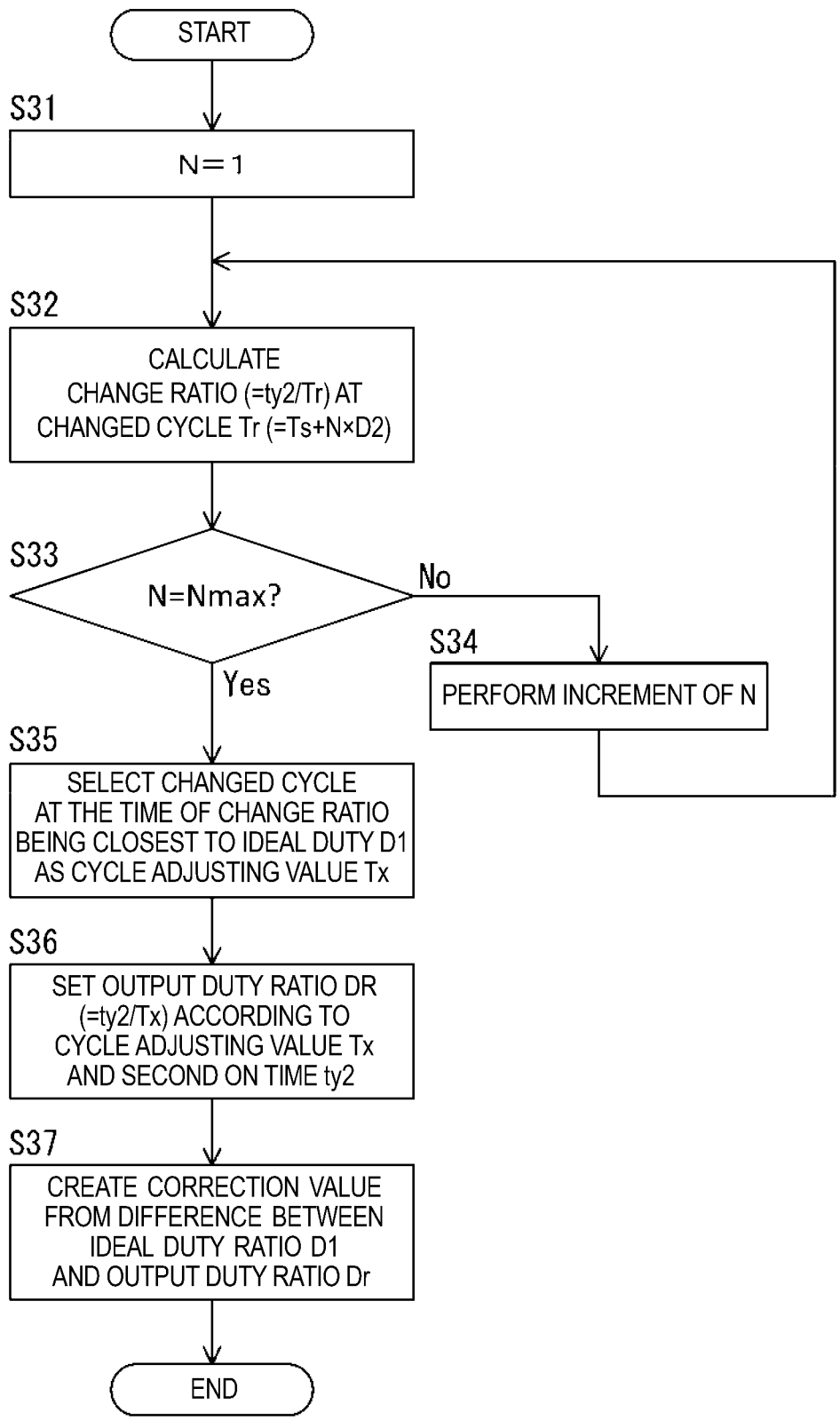
FIG. 5 is a flowchart illustrating a flow of a second adjusting process in the output duty ratio setting control shown in FIG. 3.

On the other hand, a variation range D2 used in step S22 shown in FIG. 4 is the second cycle interval that is shorter than the above-described interval of the candidate cycle values (the first cycle interval), and in the first and second adjusting processes shown in FIGS. 4 and 5, the CPU 11 (output duty ratio setting unit 104) is configured to create the cycle adjusting value Tx by changing the cycle setting value Ts set by the cycle setting unit 105 with the second cycle interval (variation range D2) that is shorter than the first cycle interval. In the example shown in FIG. 6, the second cycle interval (variation range D2) is 5 ns. In addition, in the example shown in FIG. 6, Nmax in FIGS. 4 and 5 is 4. If the cycle setting value Ts is set to 10225 ns, for example, the cycle can be increased to any of the values 10230 ns, 10235 ns, 10240 ns, and 10245 ns and can be decreased to any of the values 10220 ns, 10215 ns, 10210 ns, and 10205 ns.

A case is described where the candidate cycle values are determined in this manner, and, as shown in FIG. 7A, the ideal duty ratio D1 is determined to 23.40% in step S3 and the cycle setting value Ts is determined to 10225 ns in step S4. If the cycle setting value Ts is 10225 ns and the ideal duty ratio D1 is 23.40%, the first on-time ty1 determined in step S5 (ideal on-time) is 2392.65 ns.

As shown in FIG. 7B, if the resolution of the on-time is 5 ns and the candidate setting values that can be set are defined as shown in FIG. 7B, the candidate setting value closest to 2392.65 ns that is the first on-time (ideal on-time) is 2395 ns, and thus 2395 ns is selected as the second on-time ty2 (actual on-time). In this case, the reference ratio (ty2/Ts) is 23.4230%, but 0.0230%, which is the difference between the ideal duty ratio D1 and the reference ratio (ty2/Ts) remains.

Accordingly, in the process shown in FIG. 4, the changed cycle Tr can be acquired by increasing the set cycle setting value Ts (10225 ns) by one second cycle interval (variation range D2: 5 ns) at a time. FIG. 8 is a diagram explaining this point. The changed cycles of 10230 ns, 10235 ns, 10240 ns, and 10245 ns are acquired by increasing the changed cycle by 5 ns at a time from 10225 ns. As a result, the change ratios (ty2/Tr) corresponding to respective changed cycles can be acquired. In the example shown in FIG. 8, the change ratios, such as the change ratio of 23.4115% corresponding to 10230 ns and the change ratio of 23.4001% corresponding to 10235 ns, are acquired. Then, the change ratio (the duty ratio of the respective cycle) closest to the ideal duty ratio D1, which was selected from the acquired multiple change ratios, is 23.4001% and the cycle (changed cycle Tr) at this time is 10235 ns. In this case, 10235 ns is selected as the cycle adjusting value Tx, and this value is the actual cycle used for the PWM signals. In addition, the change ratio (that is, ty2/Tx) at this cycle adjusting value Tx is the output duty ratio Dr of the PWM signals. Then, when comparing the output duty ratio Dr with the ideal duty ratio at this time, the output duty ratio is larger by only 0.0001%, and thus this value is stored as a new correction value Df. The correction value Df is carried over to the next PWM cycle.

Here, the effect of this configuration will be exemplified.

In the present prevention, the signal generation circuit 1 has a function of changing the cycle of the PWM signals and can change the cycle without fixing the cycle, and thus noise caused by fixation of the cycle can be reduced.

Furthermore, the duty ratio setting unit 104 generates the cycle adjusting value Tx such that the adjusted ratio (the ratio of the second on-time ty2 to the cycle adjusting value Tx acquired by increasing or decreasing the cycle setting value Ts) is brought closer to the ideal duty ratio D1, and sets the output duty ratio Dr in which the cycle adjusting value Tx is to be the cycle of the PWM signals and the second on-time ty2 is to be the on-time of the PWM signals. In this manner, if the deviation from the ideal duty ratio D1 becomes large when the output duty ratio is set only by the cycle setting value Ts (the value set by the cycle setting unit 105) and the second on-time ty2 (the on-time determined according to the resolution), the ratio after the fine adjustment corresponding to the output duty ratio (adjusted ratio) can be brought closer to the target duty ratio Da by finely adjusting the cycle by increasing or decreasing the cycle setting value Ts.

The signal generation circuit 1 has the correction value creation unit 109 that creates the correction value Df used at the output duty ratio setting unit 104 from the next time onward based on the difference between the target duty ratio Da set by the target duty ratio setting unit 102 and the output duty ratio Dr set by the output duty ratio setting unit 104 (specifically, the difference between the ideal duty ratio D1 and the output duty ratio Dr). The duty ratio setting unit 104 sets the on-time, which is determined based on the ideal duty ratio D1 that is a value acquired by correcting the target duty ratio Da set by the target duty ratio setting unit 102 with the correction value Df created by the correction value creation unit 109 up to the last time and the cycle setting value Ts set by the cycle setting unit 105, to the first on-time ty1.

In this manner, it is possible to bring the output duty ratio closer to the target duty ratio Da each time, and it is also possible to reflect a portion of the target duty ratio Da that was not reflected in the output duty ratio Dr in the output duty ratio generated at and after the next time, and thus accuracy increases through multiple creation processes.

The output duty ratio setting unit 104 sets an added value acquired by adding the correction value created by the correction value creation unit 109 at the last time to the target duty ratio Da as the ideal duty ratio D1, sets the multiplication value acquired by multiplying the ideal duty ratio D1 by the cycle setting value Ts as the first on-time, and sets a value closest to the first on-time selected from the multiple candidate setting values as the second on-time. In this manner, it is possible to more reliably reflect a portion of the target duty ratio Da that was not reflected in the output duty ratio Dr in the output duty ratio to be generated from the next time onward.

If the difference between the reference ratio (ty2/Ts), which is the ratio of the second on-time ty2 to the cycle setting value Ts, and the ideal duty ratio D1 is less than the predetermined value, the output duty ratio setting unit 104 sets the reference ratio (ty2/Ts) to the output duty ratio Dr, whereas if the difference between the reference ratio (ty2/Ts) and the ideal duty ratio D1 is larger than or equal to the predetermined value, the output duty ratio setting unit 104 creates the cycle adjusting value Tx and sets the output duty ratio Dr in which the cycle adjusting value Tx is the cycle of the PWM signals and the second on-time ty2 is an on-time of the PWM signals.

In this manner, if the difference between the reference ratio (ty2/Ts) and the ideal duty ratio D1 is small, the reference ratio (ty2/Ts) can be set as it is to the output duty ratio Dr, and thus an output duty ratio Dr in which the ideal duty ratio D1 is reflected with high accuracy can be rapidly created. On the other hand, if the difference between the reference ratio (ty2/Ts) and the ideal duty ratio D1 is large, the cycle adjusting value Tx can be created by increasing or decreasing the cycle setting value Ts, and thus an adjusted ratio (ty2/Tx) close to the ideal duty ratio D1 can be acquired. Therefore, even if the difference between the reference ratio (ty2/Ts) and the ideal duty ratio D1 is large, it is possible to prevent a situation in which an output duty ratio greatly deviating from the ideal duty ratio D1 is set.

The cycle setting unit 105 sets the cycle setting value Ts such that a value is selected from the multiple candidate setting values determined with the first cycle interval. The duty ratio setting unit 104 creates the cycle adjusting value Tx by changing the cycle setting value Ts set by the cycle setting unit 105 with the second cycle interval (variation range D2) that is shorter than the first cycle interval. In this manner, the cycle adjusting value Tx can be acquired with a method in which the cycle setting value Ts set by the cycle setting unit 105 is more finely changed, and thus it is easier to obtain the cycle adjusting value Tx that is more desirable for bringing the adjusted ratio (ty2/Tx) closer to the ideal duty ratio D1.

Other Embodiments

The present disclosure is not limited to the embodiment described above using the foregoing description and drawings, and embodiments such as the following are also encompassed in the technical scope of the present disclosure.

In the first embodiment, a step-down DC-DC converter is illustrated as the voltage conversion device, but in any of the examples shown in the first embodiment and its modifications, the voltage conversion device may also be a voltage conversion device that is controlled by PWM signals, a step-up DC-DC converter, or a step-up/down DC-DC converter. Also, the voltage conversion device may be a unidirectional DC-DC converter in which the input and output sides are fixed or a bidirectional DC-DC converter.

In the first embodiment, a single-phase DC-DC converter is illustrated, but in any of the examples shown in the first embodiment and its modifications, the voltage conversion device may also be a multi-phase DC-DC converter.

In the first embodiment, a DC-DC converter using synchronous rectification method is illustrated, but in any of the examples shown in the first embodiment and its modifications, the voltage conversion device may also be a diode-type DC-DC converter in which some of switching elements are replaced by a diode.

In the first embodiment, as switching elements of the voltage conversion circuit, the switches 21 and 22 configured as an N-channel MOSFET is illustrated, but in any of the examples shown in the first embodiment and its modifications, the switching elements may also be P-channel MOSFETs or other switching elements such as bipolar transistors.

In the first embodiment, the control unit 10 is configured as a microcomputer and a configuration in which the generation unit 16 generates the PWM signals based on the setting established by the control unit 10 is illustrated, but the function of the generation unit 16 may also be included in the control unit 10. The configuration may also be a configuration in which the microcomputer can perform the function of the generation unit 16, for example.

In the first embodiment, the control unit 10 is mainly configured by a microcomputer, but the control unit 10 may also be realized by multiple hardware circuits other than a microcomputer.

In the first embodiment, the example in which the feedback calculation unit 102A functioning as a feedback calculation unit performs a feedback calculation with the PID method based on the deviation between the output voltage V2 applied to the second conduction path 32 and the predetermined target voltage Vt to calculate the on-time (target on-time ta) to be targeted in the next cycle as the operation amount is shown, but in any of the examples shown in the first embodiment and its modifications, various known feedback calculation methods can be used as long as the feedback calculation method determines the target on-time ta such that the output voltage V2 can be brought closer to the target voltage Vt based on the output voltage V2 applied to the second conduction path 32 and the predetermined target voltage Vt.

In the first embodiment, the second on-time determination unit 104C determines, from the multiple setting candidate values larger than or equal to or smaller than or equal to the latest first on-time ty1 determined by the first on-time determination unit 104B, the candidate setting value closest to the latest first on-time as the second on-time ty2, but in any of the examples shown in the first embodiment and its modifications, the second on-time setting unit 104C may also determine, from the multiple setting candidate values smaller than or equal to the latest first on-time ty1 determined by the first on-time determination unit 104B, the candidate setting value closest to the latest first on-time as the second on-time ty2, and may determine, from the multiple setting candidate values larger than or equal to the latest first on-time ty1 determined by the first on-time determination unit 104B, the candidate setting value closest to the latest first on-time as the second on-time ty2.

In the first embodiment, the configuration in which the correction value creation unit 109 is provided and the ideal duty ratio D1 is created by reflecting the correction value Df is shown, but the configuration may also be a configuration in which the correction value creation unit 109 is not provided. In this case, the target duty ratio Da may be set to the ideal duty ratio D1.

What is claimed is:

1. A vehicle-mounted signal generation circuit for generating a PWM signal to be provided to a voltage conversion device that outputs an output voltage generated by converting an input voltage with an on/off operation of a switch according to the PWM signal, the vehicle-mounted signal generation circuit comprising:
an electronic control unit that is configured to:
generate the PWM signal for the voltage conversion device;
set a target duty ratio, which is a target value of a duty ratio of the PWM signal, based on an output from the voltage conversion device;
set a cycle setting value of the PWM signal and to change the cycle setting value set according to passage of time; and
set an output duty ratio, which is a value of a duty ratio based on the target duty ratio set and the cycle setting value set,
wherein the electronic control unit generates the PWM signal in which the duty ratio is set to the output duty ratio set, and
wherein, when an on-time based on an ideal duty ratio, which is a value in which the target duty ratio set is reflected, and the cycle setting value set is regarded as a first on-time, and a value close to the first on-time that is selected from a plurality of candidate setting values that are defined based on a predetermined resolution is regarded as a second on-time, the electronic control unit is configured:
to create a cycle adjusting value such that an adjusted ratio, which is a ratio of the second on-time to the cycle adjusting value acquired by increasing or decreasing the cycle setting value, is brought closer to the ideal duty ratio, and
to set the output duty ratio such that the cycle adjusting value serves as a cycle of the PWM signal and the second on-time serves as an on-time of the PWM signal.

2. The vehicle-mounted signal generation circuit according to claim 1,
wherein the electronic control unit is configured to create a correction value, which is used from the next time onward, based on a difference between the target duty ratio set and the output duty ratio set, and
wherein the electronic control unit is configured to set the first on-time to an on-time that is determined based on the ideal duty ratio, which is a value acquired by correcting the target duty ratio set with the correction value that was created up to the last time and the cycle setting value set.

3. The vehicle-mounted signal generation circuit according to claim 2,
wherein the electronic control unit is configured to set an added value, which is acquired by adding the correction value created at the last time to the target duty ratio, as an ideal duty ratio, to set a multiplication value acquired by multiplying the ideal duty ratio by the cycle setting value as the first on-time, and to set a value closest to the first on-time that is selected from the plurality of candidate setting values as the second on-time.

4. The vehicle-mounted signal generation circuit according to claim 1,
wherein the electronic control unit is configured, if a difference between a reference ratio, which is a ratio of the second on-time to the cycle setting value, and the ideal duty ratio is less than a predetermined value, to set the reference ratio as the output duty ratio, if the difference between the reference ratio and the ideal duty ratio is larger than or equal to the predetermined value, to create the cycle adjusting value and set an output duty ratio in which that cycle adjusting value is the cycle of the PWM signal and the second on-time is an on-time of the PWM signal.

5. The vehicle-mounted signal generation circuit according to claim 1,
wherein the electronic control unit is configured to set the cycle setting value such that a value is selected from a plurality of candidate setting values determined with a first cycle interval, and
wherein the electronic control unit is configured to create the cycle adjusting value by changing the cycle setting value set with a second cycle interval that is shorter than the first cycle interval.

6. A vehicle-mounted power supply device comprising:
the vehicle-mounted signal generation circuit according to claim 1; and
the voltage conversion device.

* * * * *